United States Patent [19]
Whitehead et al.

[11] Patent Number: 6,091,996
[45] Date of Patent: Jul. 18, 2000

[54] PRINTED CIRCUIT BOARD ANALYSIS AND REPAIR SYSTEM

[75] Inventors: Cynthia Jane Whitehead, South Lake; Stephen J. Foster, Garland; Evan J. Evans, Alvord, all of Tex.

[73] Assignee: Electronic Packaging Company, Dallas, Tex.

[21] Appl. No.: 09/033,359

[22] Filed: Mar. 2, 1998

[51] Int. Cl.[7] .............................. G06K 9/34; G01N 21/88
[52] U.S. Cl. ........................... 700/57; 382/149; 382/151; 700/59
[58] Field of Search .................................. 382/147, 149, 382/151; 700/59, 57, 58; 324/753

[56] References Cited

U.S. PATENT DOCUMENTS

| | | |
|---|---|---|
| 4,469,553 | 9/1984 | Whitehead .................................. 216/60 |
| 5,204,912 | 4/1993 | Schimanski .............................. 382/147 |
| 5,369,431 | 11/1994 | Levy et al. .............................. 348/126 |
| 5,513,099 | 4/1996 | Schein ................................ 364/167.01 |
| 5,657,075 | 8/1997 | Roessner ................................. 348/126 |
| 5,764,536 | 6/1998 | Yamamoto et al. ....................... 701/81 |
| 5,812,693 | 9/1998 | Burt et al. ............................... 382/149 |
| 5,834,323 | 11/1998 | Ghafghaichi et al. .................... 438/17 |

Primary Examiner—Thomas C. Lee
Assistant Examiner—Ilwoo Park
Attorney, Agent, or Firm—Locke Liddell & Sapp LLP

[57] ABSTRACT

A method for repairing a printed circuit board includes the step of generating fault data relating to the plots or layout of a printed circuit board from a circuit board testing device. The printed circuit board under test is positioned on a workstation. An image containing repair data based on the fault data is projected directly onto the printed circuit board and is overlaid in registration with the plot or layout of the printed circuit board to assist in operator repair.

2 Claims, 5 Drawing Sheets

PRINTED CIRCUIT BOARD ANALYSIS AND REPAIR SYSTEM

TECHNICAL FIELD OF THE INVENTION

The present invention relates to printed circuit board repair and rework systems and methods, and more particularly, to a method for projecting graphic repair data directly onto a printed circuit board to be repaired.

BACKGROUND OF THE INVENTION

Printed circuit boards comprise a support structure formed from an electrically insulative material and having formed on at least one side thereof a series of electrically conductive paths or leads in the form of traces and pads. Typically, a plurality of apertures are formed through the board, and components are mounted on the board by insertion of electrically conductive pins extending from each component through the apertures. Solder connections are then formed between the conductive pins of the components and the conductive leads of the printed circuit board, thereby completing the necessary electrical connections between the various components.

During fabrication of the printed circuit board, defects occur, such as, for example, shorts between traces and pads as well as defects in the continuity of traces resulting in "open" faults. Various systems have been proposed for the repair of printed circuit boards, such as, for example, the system and method disclosed in U.S. Pat. No. 4,469,553 issued to Robert E. Whitehead on Sep. 4, 1984. The system of the '533 Patent projects circuit board data, such as, for example, "Gerber" data from a plasma screen of a computer onto a half mirror. A printed circuit board is positioned beneath the mirror. The board can be viewed through the mirror while at the same time the "Gerber" data is projected on the mirror in registry with the circuit board, so that an operator can view the circuit board through the mirror for correlating the "Gerber" data projected onto the mirror with the actual circuit board positioned below the mirror.

A need has arisen for a improved system for the analysis and repair of errors found in printed circuit board manufacture.

SUMMARY OF THE INVENTION

In accordance with the present invention, a method for repairing a printed circuit board includes the step of generating fault data relating to the plots or layout of a printed circuit board from a circuit board testing device. The printed circuit board under test is positioned on a workstation. An image is projected containing repair data based on the fault data is projected directly onto the printed circuit board and is overlaid in registration with the plot or layout of the printed circuit board to assist in operator repair.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
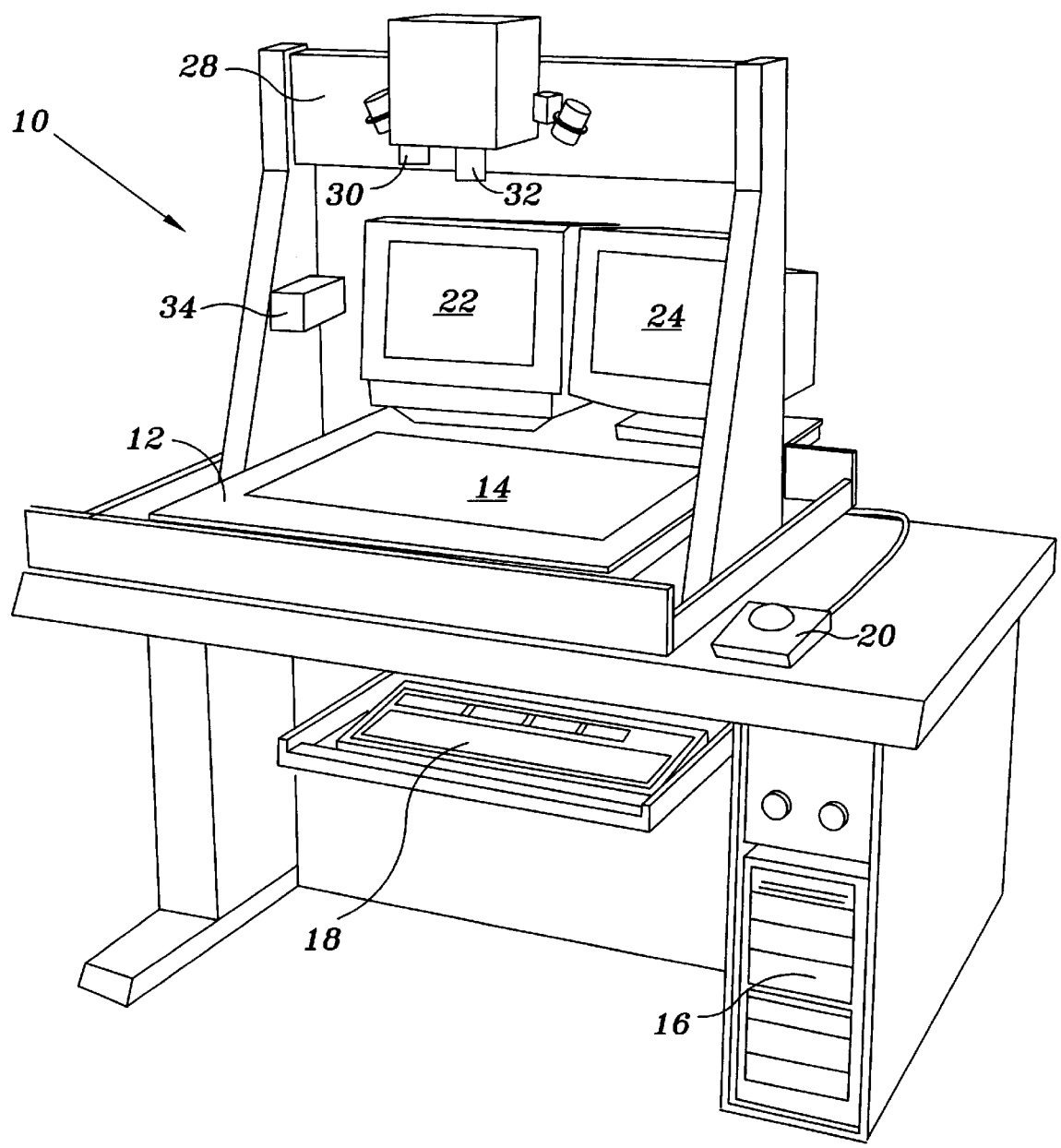
FIG. 1 is a perspective view of a repair workstation for carrying out the present method.

Referring to FIG. 1, the present method is performed at a repair workstation, generally identified by the numeral 10. Workstation 10 includes a work surface 12 on which a printed circuit board 14 is positioned. Printed circuit board 14 constitutes a printed circuit board which has been tested utilizing a testing device which generates fault data so that printed circuit board 14 can be analyzed and repaired.

Workstation 10 further includes a computer 16, keyboard 18, mouse 20, and monitors 22 and 24. Positioned above work surface 12 is an X/Y positioning mechanism 28. Mounted to positioning mechanism 28 is a projection system 30. Projection system 30 is transportable by position mechanism 28 to various positions over printed circuit board 14. Projection system 30 may comprise, for example, an LCD (Liquid Crystal Display) high resolution video graphics projector such as Model VP800 manufactured and sold by Lightware, Inc.

An important aspect of the present invention is that projection system 30 projects graphic repair data, such as, for example, traces, pads, components and other information directly onto the surface of printed circuit board 14 that is to be repaired. Utilizing positioning mechanism 28, the repair data can be projected by projection system 30 in exact alignment with the features of printed circuit board 14. Additionally, the colors of the projected image can be changed to provide for maximum contrast between the color of the actual printed circuit board 14 and the graphic data projected thereon.

Workstation 10 further includes a video camera 32 and lens assembly for capturing an image of printed circuit board 14 together with the image of the projected graphic repair data for display on monitors 22 and 24. Computer 16 also includes necessary software for determining a probable fault location. Computer 16 provides the driver functions for projection system 30, the management of computer aided repair and fault prediction software and also controls X/Y position mechanism 28. Also mounted to repair workstation 10 is a microscope 34 to assist in viewing of faults on printed circuit board 14 together with the projected repair data.

Referring now to FIGS. 2–5, the present method steps of the present invention are illustrated in block diagram format. Inspection begins at step 40. The circuit board name is selected at step 42, and the circuit board is placed on work surface 12 at step 44. A decision is made at step 46 to determine whether there is an error log file for the printed circuit board 14 under test. If the decision is yes, an error log is loaded at step 48, and the serial number of the printed circuit board 14 is entered at step 50. If the decision is no at decision block 46, the printed circuit board failure ticket is examined at step 52.

The first test point is entered into computer 16 at step 54, and the second test point is entered into computer 16 at step 56. Once the test points have been entered or the board's serial number entered at step 50, a decision is made at decision block 58 as to whether both test points are located in the same network (NET) trace. If the test points are not in the same network trace, the method continues to step 110, FIG. 4. If the test points are in the same network, a display is created on monitors 22 and 24 at step 60 to display that the fault or error is an open circuit. The video image of the network trace is then projected onto printed circuit board 14 using projection system 30 at step 62. The X/Y position mechanism 28 is then positioned to center the first test point at step 64. A meter probe is positioned on the test point at step 66. The X/Y position 28 is then moved to center the second test point at step 68. The additional meter probe is then placed on the second test point at step 70 to determine whether the network is open at step 72. If the network trace is not open, the network continues with step 102, FIG. 3. If the network trace is open, the primary board side is highlighted via projection system 30 at step 74. Through the use of arrow keys on keyboard 18 or mouse 20, a scrolling process takes place to move X/Y position mechanism 28 and projection system 30 at step 76. Microscope 34 can then be used to view the open network at steps 78 or video camera 32 together with a monitor 22 or 24 can be used view the open network.

Figure 2:
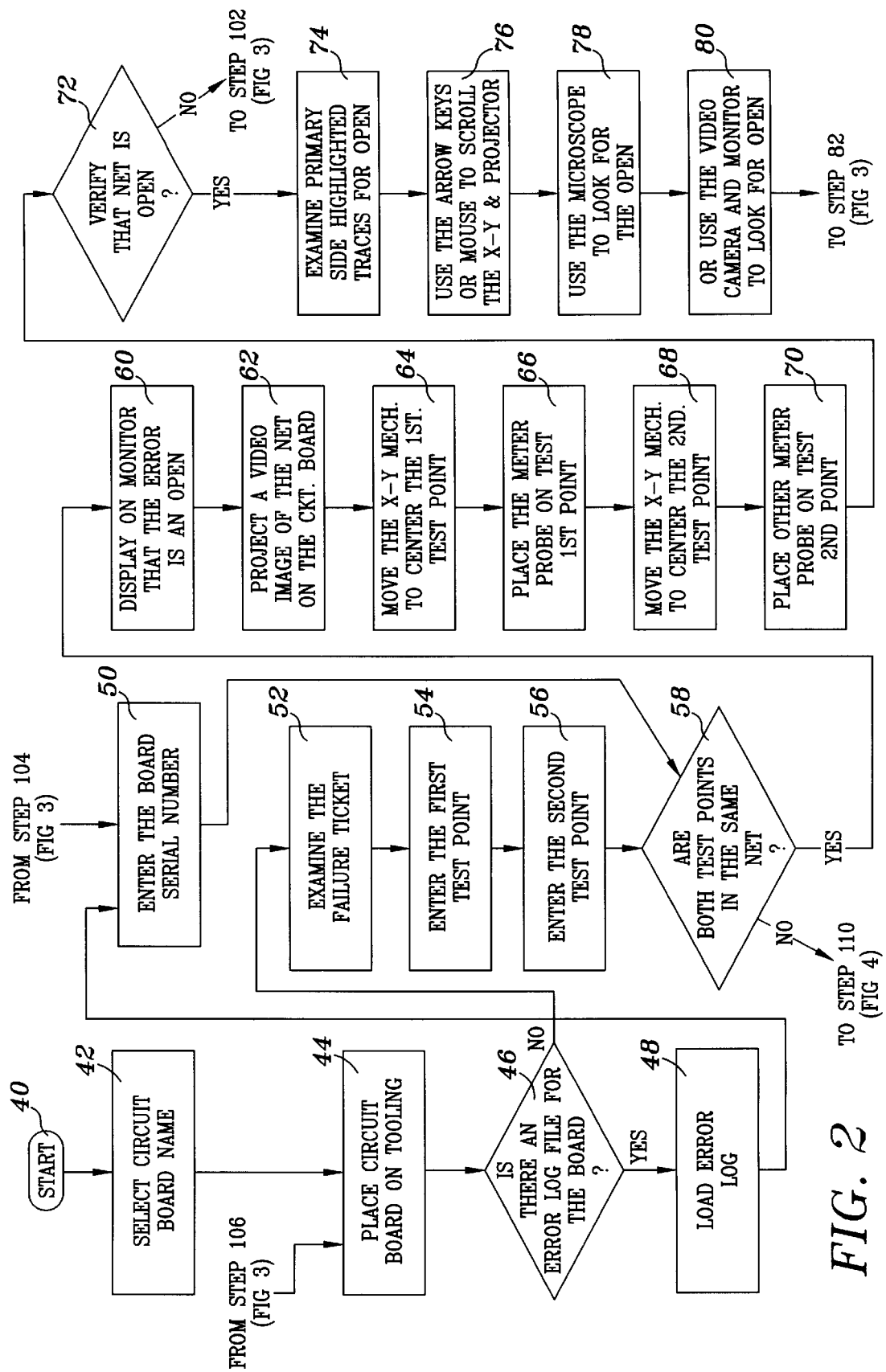
FIGS. 2–5 are block diagrams illustrating the steps of the present method for repairing printed circuit boards.
Figure 3:
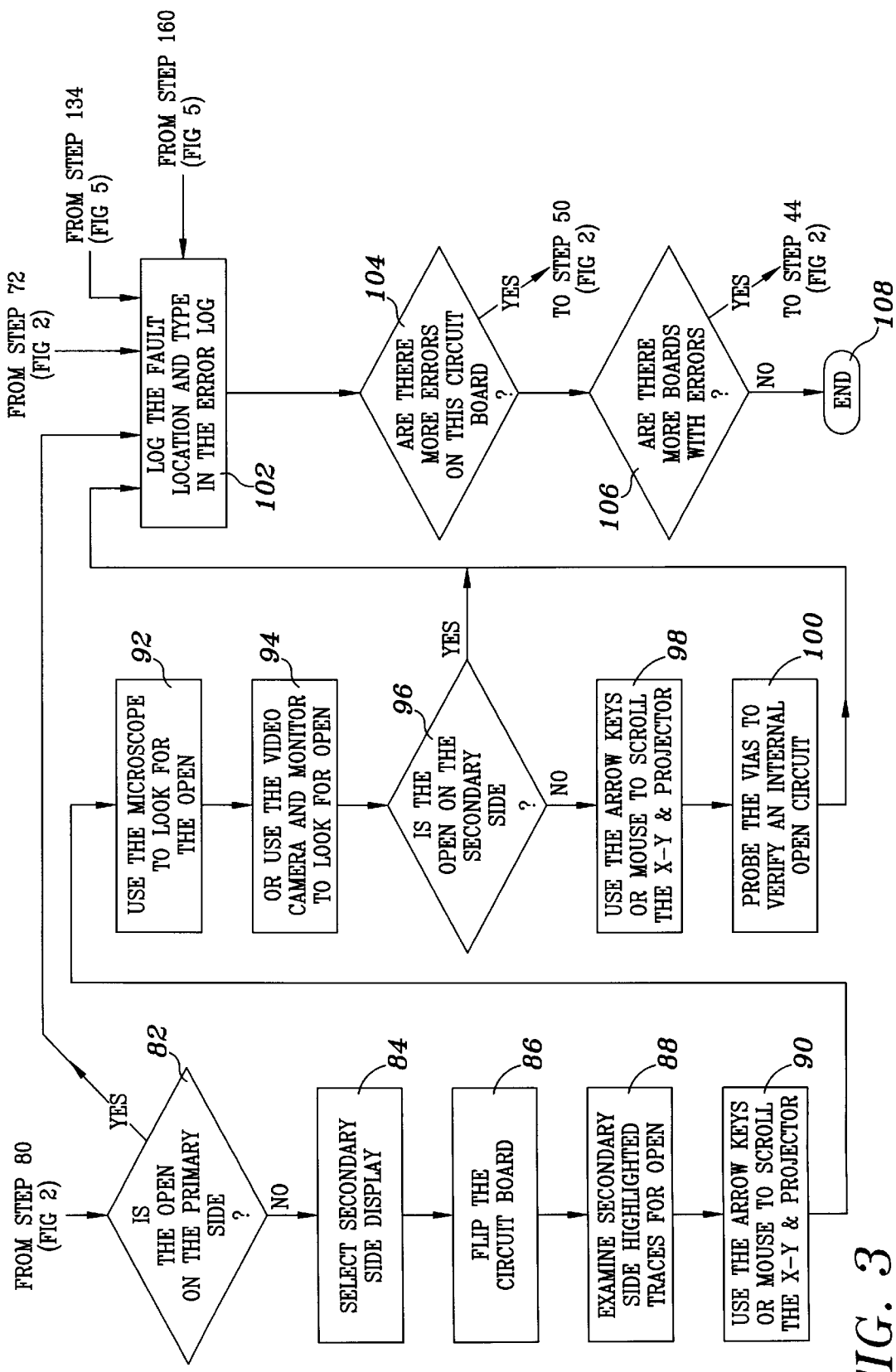

Referring now to FIG. 3 continuing from step 80 (FIG. 2), a decision is made to determine if the open network is on the primary side of the printed circuit board at step 82. If the decision is no, the secondary side of the printed circuit board is selected at step 84, requiring the circuit board to be turned over for positioning on work surface 12 at step 86. The secondary side of the printed circuit board traces are highlighted by projection system 30 at step 88. Use of arrow keys on keyboard 18 or mouse 20 are utilized to scroll X/Y position mechanism 28 and projection system 30 at step 90 to position the projection of the fault data over the traces and pads of printed circuit board 14. Microscope 34 may be utilized to look for an open network at step 92. Additionally and alternatively, video camera 32 can be utilized for viewing the open network at step 94. If the decision is yes at step 82, the next step is step 102.

A decision is then made to determine whether the open network is found on the secondary side of printed circuit board 14 at step 96. If the decision is yes at step 96, the next step is step 102. If the decision is no, the arrow keys of keyboard 18 and mouse 20 are utilized to scroll X/Y position mechanism 28 and projection system 30 at step 98. The vias are probed to verify an internal open circuit at step 100. The fault location and type of fault is logged in the error log at step 102. A determination is made at step 104 to determine if there are any additional errors on the printed circuit board 14 under repair. If there are no additional errors, a decision is made at to whether there are additional boards with errors at step 106. If there are no additional boards, the process terminates at block 108. If more errors are located on the same printed circuit board 14, at step 104, the process returns to step 50 (FIG. 2). If there are additional boards having errors present, at step 106, the process continues to step 44 (FIG. 2).

Figure 4:
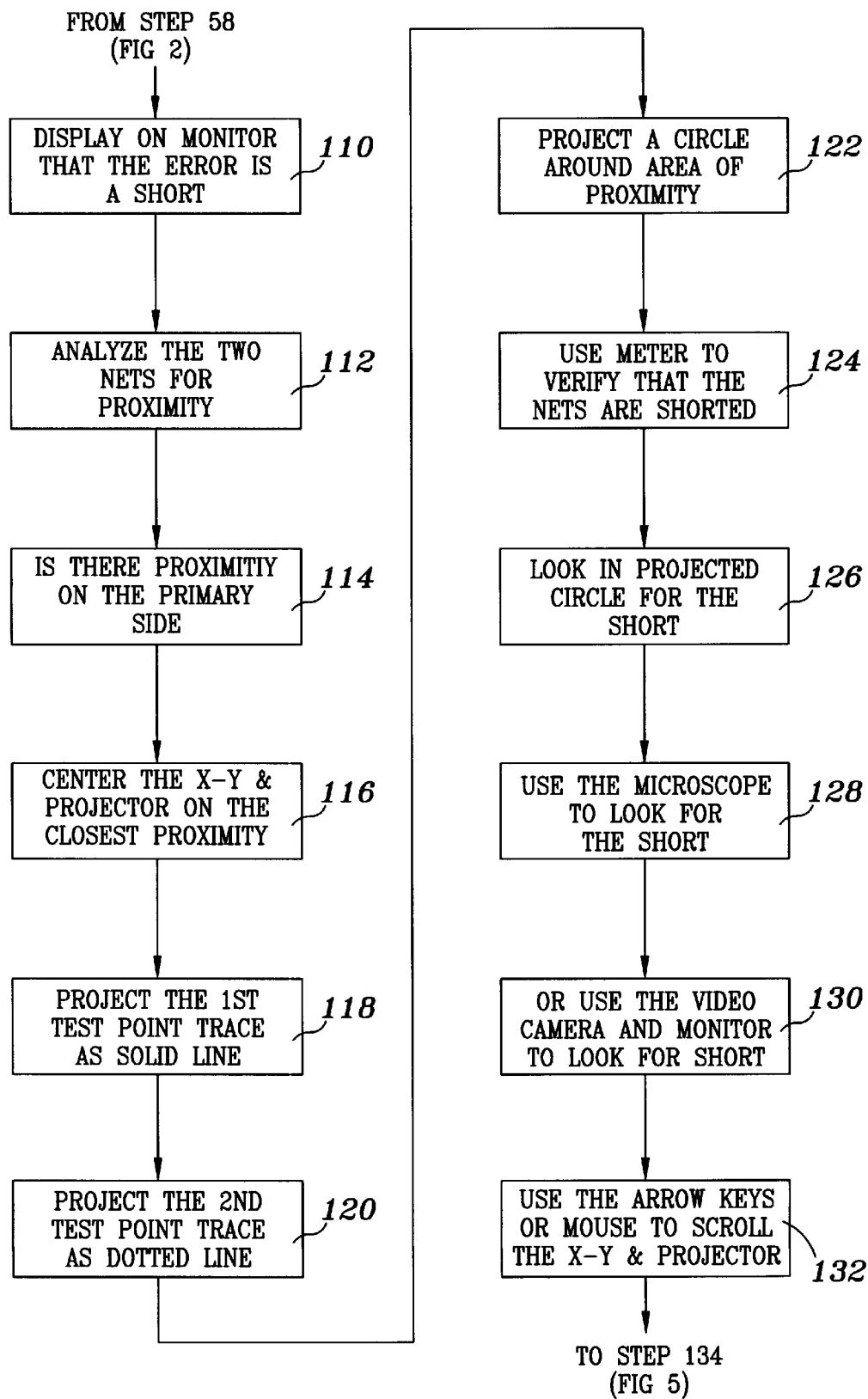

Referring now to FIG. 4, if the decision at step 58 (FIG. 2) was no, monitor 22 or 24 displays that the error is a short at step 110. An analysis is made at step 112 to determine the proximity between the two network traces. An inquiry is made at step 114 to determine if there is proximity on the primary side of printed circuit board 14. The X/Y position mechanism 28 and projection system 30 is positioned to the closest proximity at step 116. The first test point trace is projected as a solid line by projection system 30 onto printed circuit board 14 at step 118. The second test point trace is projected as a dotted line onto the surface of printed circuit board 14 by projection system 30 at step 120. At step 122, a circle is projected by projection system 30 around the area of proximity. A meter is utilized to verify that the network traces are shorted at step 124. The system repair operator views the projected circle to determine the presence of a short at step 126. Microscope 34 may be also used to look for the presence of a short at step 128. Further, video camera 32 and a monitor 22 or 24 may be utilized to determine the presence of a short at step 130. Arrow keys on keyboard 18 and mouse 20 are utilized to scroll X/Y position mechanism 28 at step 132.

Figure 5:
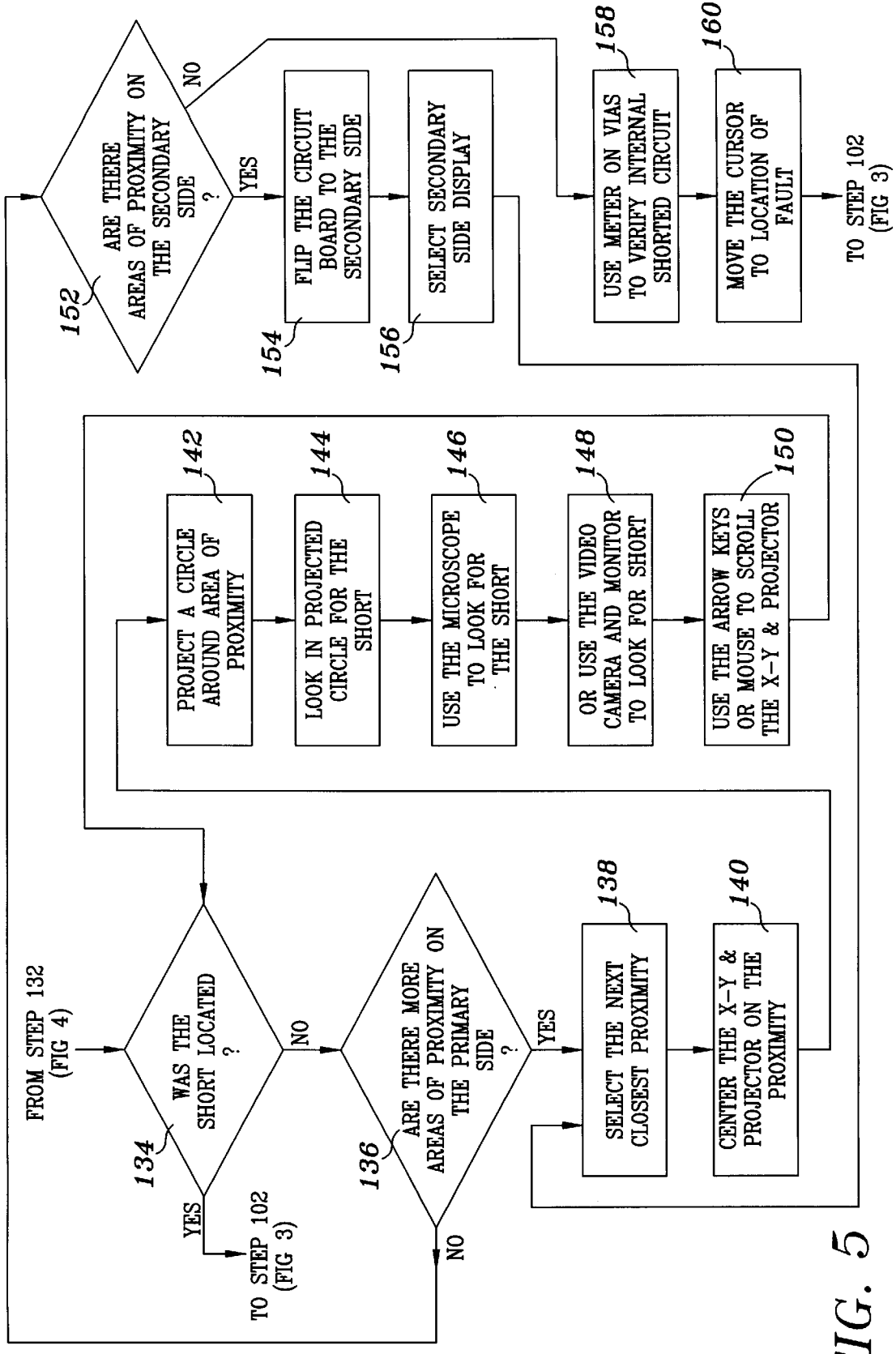

Referring now to FIG. 5, a decision is made at step 134 to determine if the short was located. If the short was located, the process continues to step 102 (FIG. 3). If no short was detected at step 134, a decision is made to determine whether there are additional areas of proximity on the primary side of printed circuit board 14 at step 136. If the decision is yes, the next step is step 102 (FIG. 3).

If the decision is yes at step 136, the next closest proximity network trace is selected at step 138. The X/Y position mechanism 28 and projection system 30 is then centered on the proximity at step 140. At step 142, a circle is projected around the area of proximity. The projected circle is viewed to determine if a short is present at step 144. Microscope 34 may be utilized at step 146 to determine the presence of a short. Video camera 32 and a monitor 20 or 22 can be utilized to determine the presence of a short at step 148. Arrow keys on keyboard 18 and mouse 20 can be utilized to scroll X/Y position mechanism 28 and projection system 30 over the proximity at step 150. A determination is then made again to determine whether the short was located at step 134.

In the event that there are no more areas of proximity on the primary side of printed circuit board 14, at step 136 a determination is made at step 152 to determine if there are areas of proximity on the secondary side of printed circuit board 14. If the answer is yes, circuit board 14 is turned over to expose the secondary side at step 154. The secondary side display is selected at step 156, and step 138 is again carried out.

If the decision at step 152 is no, a meter is used to verify an internal shorted circuit at step 158. A cursor is then moved to the location of the fault at step 160 and the process continues to step 102 (FIG. 3).

It therefore can be seen that the present invention provides for a method for the analysis and repair of errors found on printed circuit boards by projecting graphic repair data directly onto the printed circuit board that is to be repaired.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. A method for repairing a printed circuit board comprising the steps of:

generating fault data relating to the plot or layout of a printed circuit board from a printed circuit board testing device;

positioning the printed circuit board on a workstation;

projecting an image containing repair data based on the fault data directly onto the printed circuit board overlaid in registration with the plot or layout of the printed circuit board capturing with a camera an image of the printed circuit board and projected image of repair ;ata: and displaying the camera captured image on a visual display.

2. The method of claim 1 and further including:

projecting onto the printed circuit board indicia indicating the location of a fault.

\* \* \* \* \*